US012720922B2

(12) United States Patent
Mai et al.

(10) Patent No.: US 12,720,922 B2
(45) Date of Patent: Aug. 25, 2026

(54) MICRO LED, SYSTEM OF TRANSFERRING SAME IN MASS, AND MASS TRANSFER METHOD

(71) Applicant: Century Technology (Shenzhen) Corporation Limited, Shenzhen (CN)

(72) Inventors: Chen-Fu Mai, New Taipei (TW); Meng-Chieh Tai, New Taipei (TW); Yu Zhang, Shenzhen (CN); Min Hu, Shenzhen (CN); Lan-Qing Xiao, Shenzhen (CN); Ping Liu, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 769 days.

(21) Appl. No.: 18/079,770

(22) Filed: Dec. 12, 2022

(65) Prior Publication Data

US 2023/0215987 A1 Jul. 6, 2023

(30) Foreign Application Priority Data

Jan. 5, 2022 (CN) ......................... 202210006949.7

(51) Int. Cl.

| | |
|---|---|
| ***H10H 20/84*** | (2025.01) |
| ***H10P 72/00*** | (2026.01) |
| ***H10P 72/50*** | (2026.01) |
| *H10W 90/00* | (2026.01) |

(52) U.S. Cl.

CPC ......... *H10H 20/84* (2025.01); *H10P 72/0446* (2026.01); *H10P 72/50* (2026.01); *H10W 90/00* (2026.01)

(58) Field of Classification Search

CPC ...... H10H 20/84; H10H 20/01; H10H 20/857; H10H 29/142; H10H 20/018; H01L 21/67144; H01L 21/68; H01L 25/0753; H01L 21/67138

See application file for complete search history.

(56) References Cited

U.S. PATENT DOCUMENTS 10,748,792 B2 * 8/2020 Chen .................. H10P 72/0438

FOREIGN PATENT DOCUMENTS

TW 201916320 A 4/2019

* cited by examiner

*Primary Examiner* — Fernando L Toledo
*Assistant Examiner* — Jorge Andres Lopez
(74) *Attorney, Agent, or Firm* — ScienBiziP, P.C.

(57) ABSTRACT

A method and system for rapid and efficient mass transfer of a quantity of micro LEDs from storage onto a display substrate provides a micro LED which includes an electrode part, a luminous part, and a suspending part. The electrode part includes at least one electrode. The luminous part emits a certain color of light. The matter density of the suspending part is reduced to be less than that of a liquid holding the quantity of micro LEDs in suspension, and also less than the matter density of the other two parts of the micro LED. Even before illumination, the suspending part has the same color as the color of light to be emitted by that micro LED. A mass transfer system and a mass transfer method are disclosed.

5 Claims, 10 Drawing Sheets

MICRO LED, SYSTEM OF TRANSFERRING SAME IN MASS, AND MASS TRANSFER METHOD

FIELD

The subject matter herein generally relates to lighting, specifically to a micro-LED, a mass transfer system for transferring micro LEDs, and a mass transfer method.

BACKGROUND

Liquid crystal displays (LCDs) are currently a favorite technology. As technology for display devices develops, the requirements of display resolution and contrast are getting higher and higher. Micro light-emitting diodes (LEDs) technology offers higher brightness, better efficiency of luminosity, and lower power dissipation, and has prospects for further development.

However, because of the small sized of micro LEDs, transferring a large number of micro LEDs to a display substrate with high reliability during the manufacturing processes remains challenging.

BRIEF DESCRIPTION OF THE DRAWINGS

Implementations of the present disclosure will now be described, by way of embodiment, with reference to the attached figures.

DETAILED DESCRIPTION

Figure 1:
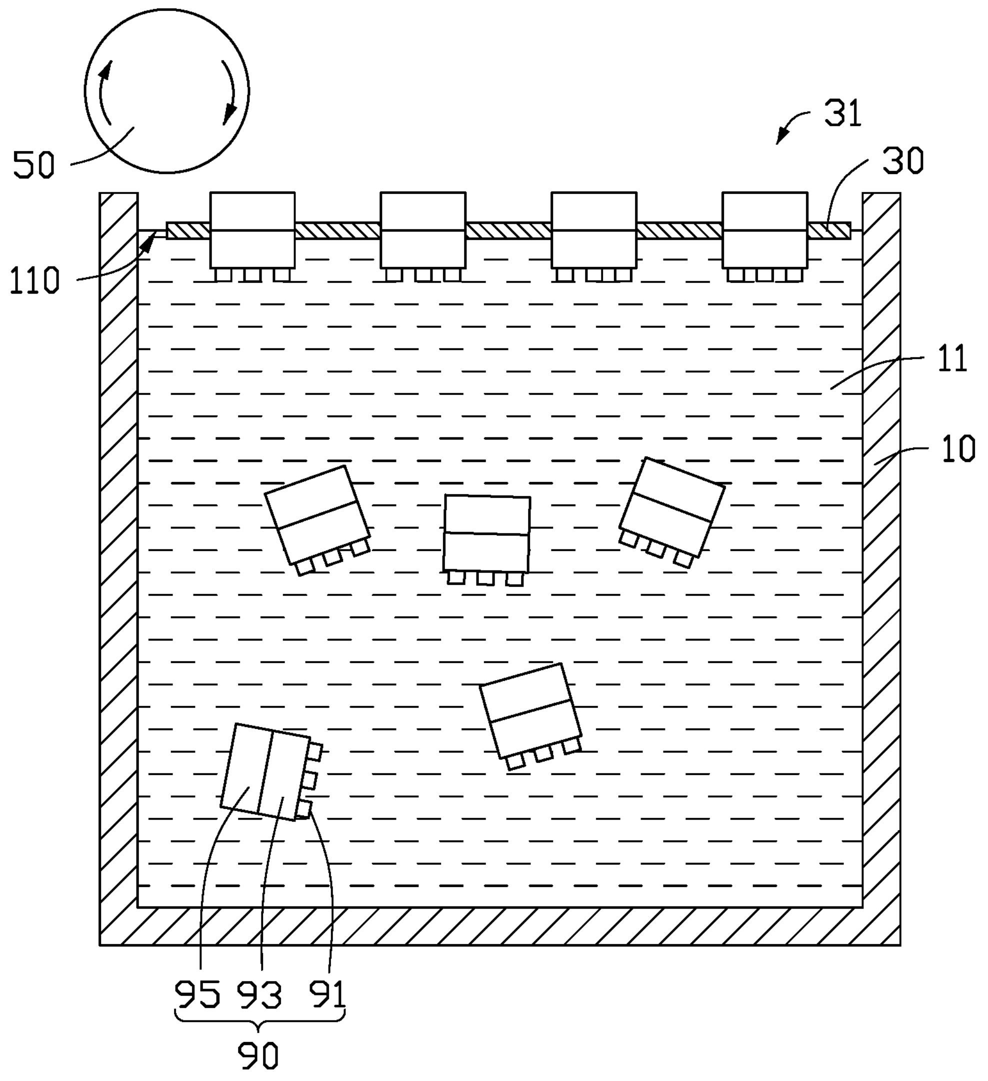
FIG. 1 is a sectional side view of a mass transfer system according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale, and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

FIG. 1 shows a mass transfer system 100 used to transfer a large number (tens or hundreds of thousands) of micro LEDs at one time according to an embodiment of the present disclosure. The mass transfer system 100 includes a chamber 10, a positioning substrate 30, and a transfer roller 50.

The chamber 10 accommodates a liquid in which micro LEDs (micro LEDs 90) are held in suspension (suspension 11). The suspension 11 carries a plurality of micro LEDs 90, and an average density of each micro LED 90 is less than that of the liquid element of the suspension 11. A positioning substrate 30 is on a top surface 110 of the suspension 11 and a plurality of positioning holes 31 is defined in the positioning substrate 30. Each positioning hole 31 is configured to expose a portion of one micro LED 90. The micro LEDs 90 can pass through the positioning holes 31 to be partially exposed on a side of the positioning substrate 30 away from the top surface 110. Each positioning hole 31 allows only one micro LED 90 to pass through at one time.

The transfer roller 50 is configured to roll along the topmost side of the positioning substrate 30 and the exposed portion of micro LEDs 90 in the positioning holes 31 adheres to the roller 50. The micro LEDs 90 can then be transferred to an array substrate, for example, of a display panel.

In some embodiments, the mass transfer system 100 further includes the suspension 11 in which the micro LEDs 90 are held in suspension. An average density of each micro LED 90 is less than that of the liquid of suspension 11.

Figure 2:
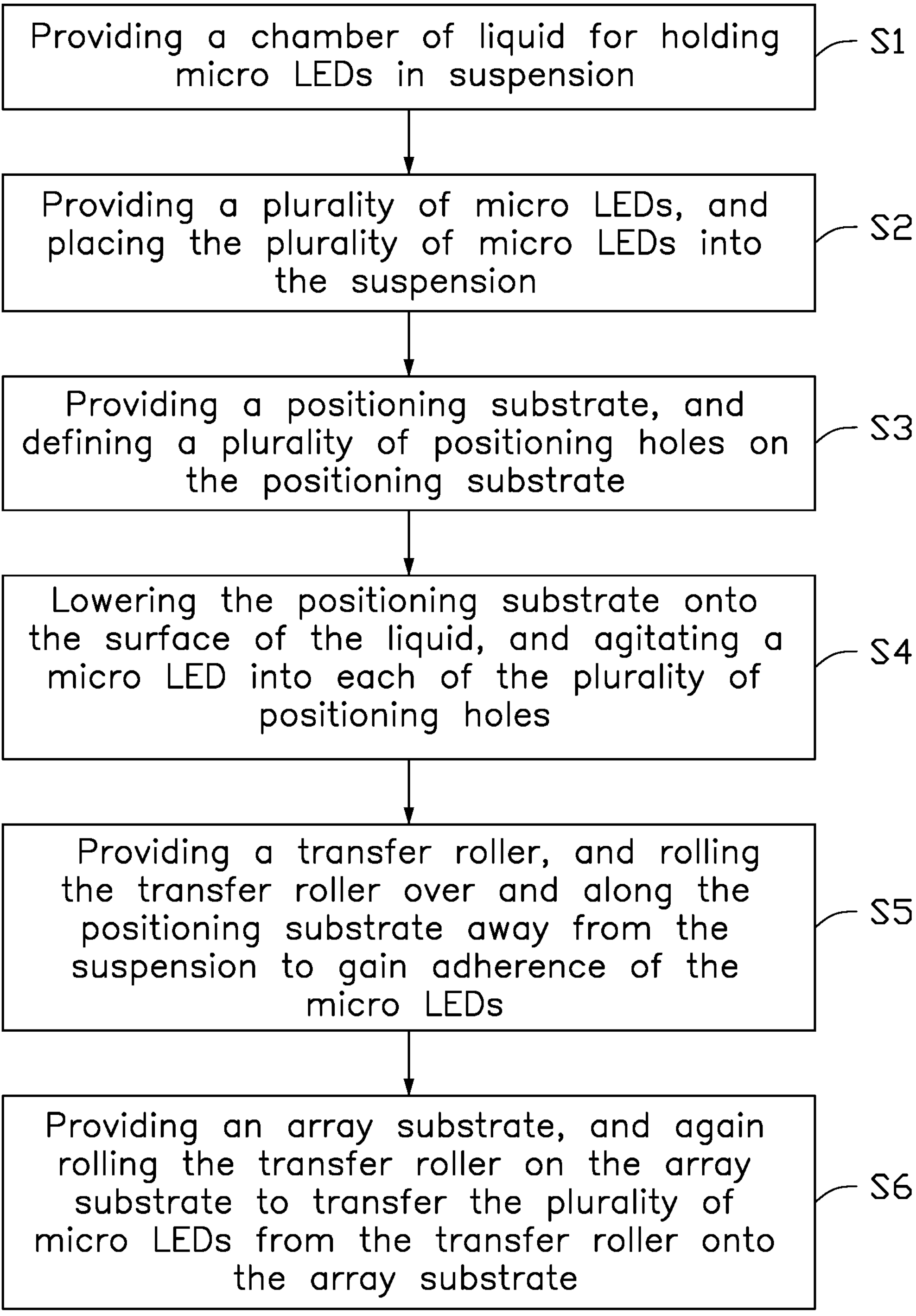
FIG. 2 is a flowchart of a mass transfer method according to an embodiment of the present disclosure.

FIG. 2 shows a flow chart of a mass transfer method according to an embodiment of the present disclosure. The mass transfer method comprises:

Block S1: providing a chamber of liquid for holding micro LEDs in suspension;

Block S2: providing a plurality of micro LEDs, and placing the plurality of micro LEDs into the suspension;

Block S3: providing a positioning substrate, and defining a plurality of positioning holes on the positioning substrate;

Block S4: lowering the positioning substrate onto the surface of the liquid, and agitating a micro LED into each of the plurality of positioning holes;

Block S5: providing a transfer roller, and rolling the transfer roller over and along the positioning substrate away from the suspension to gain adherence of the micro LEDs;

Block S6: providing an array substrate, and again rolling the transfer roller on the array substrate to transfer the plurality of micro LEDs from the transfer roller onto the array substrate.

The mass transfer method shown in FIG. 2 is provided by way of embodiment, as there are a variety of ways to carry out the method. The method described below can be carried out using the configurations illustrated in FIGS. 3 through 9, for example, and various elements of these figures are referenced in explaining the method. Each block shown in FIG. 2 represents one or more processes, methods, or subroutines, carried out in the method. Additionally, the illustrated order of blocks is by example only and the order of the blocks can change. The method can begin at Block S1, and the mass transfer system 100 endorses the mass transfer method as follows.

Figure 3:
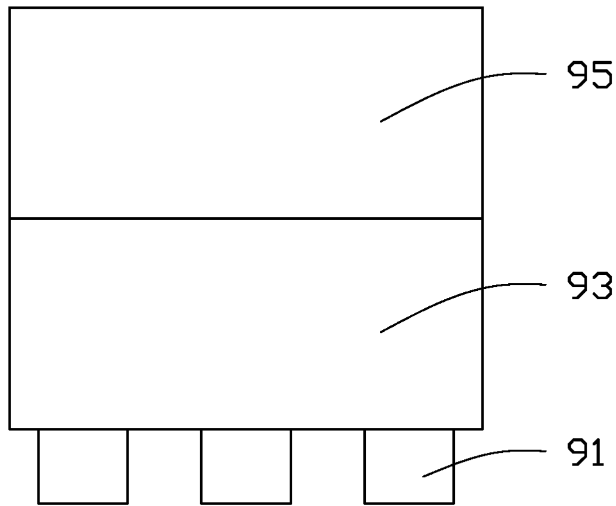
FIG. 3 is a side view of a transferable micro LED according to an embodiment of the present disclosure.

In one embodiment, as FIG. 3 shows, each of the micro LEDs 90 provided in Block S2 comprises an electrode part 91, a suspending part 95, and a luminous part 93 sandwiched therebetween, these elements being arranged layer-by-layer. Each micro LED 90 can be a flip chip, wherein the electrode part 91 comprises a cathode electrode and an anode electrode, the luminous part 93 is (in FIG. 3) above the electrode part 91. The suspending part 95 is the topmost layer.

Figure 4:
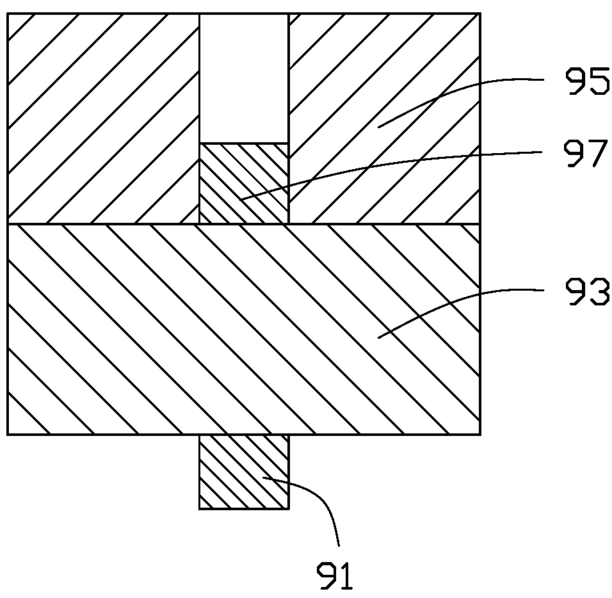
FIG. 4 is a sectional side view of a micro LED according to another embodiment of the present disclosure.

As FIG. 4 shows, in another embodiment, each of the micro LEDs 90 provided in Block S2 can comprise substantially the same layers, in the same stacking order. Each micro LED 90 can be a vertical micro LED, wherein the electrode part 91 comprises lower electrode only. An upper electrode 97 can be located immediately above luminous part 93. The lower electrode and the upper electrode 97 respectively function as the cathode electrode and the anode electrode of each micro LED 90. The upper electrode 97 seen in FIG. 4 is exposed from the suspending part 95.

In one embodiment, the material of the suspending part 95 is a light-transmitting photoresist with a same color as the color of light emitted by the micro LED 90. In other embodiments, the material of the suspending part 95 can be a colorless transparent photoresist or other translucent materials with a same color as the color of light emitted by the micro LED 90.

In one embodiment, a density of the suspending part 95 is less than that of the electrode part 91 and that of the luminous part 93. As a result, when the micro LED 90 is in the suspension 11, the suspending part 95 will always be face up because of buoyancy. When the micro LED 90 is floating on the surface 110 of the suspension 11, the electrode part 91 is submerged directly below the suspending part 95.

In one embodiment, Block S2 further includes preparing the micro LEDs 90. Preparation of the micro LEDs 90 includes and comprises: arranging a plurality of electrode parts 91 on a substrate, then arranging a luminous part 93 on each one of the electrode parts 91, then arranging a suspending part 95 on each one of the luminous parts 93, and taking the plurality of electrode parts 91 out of the substrate. In another embodiment, preparing the plurality of micro LEDs 90 can also comprise: laying an electrode layer, a light-emitting layer, and a suspension layer successively on the substrate, and cutting away the substrate to obtain the plurality of micro LEDs 90.

Figure 5:
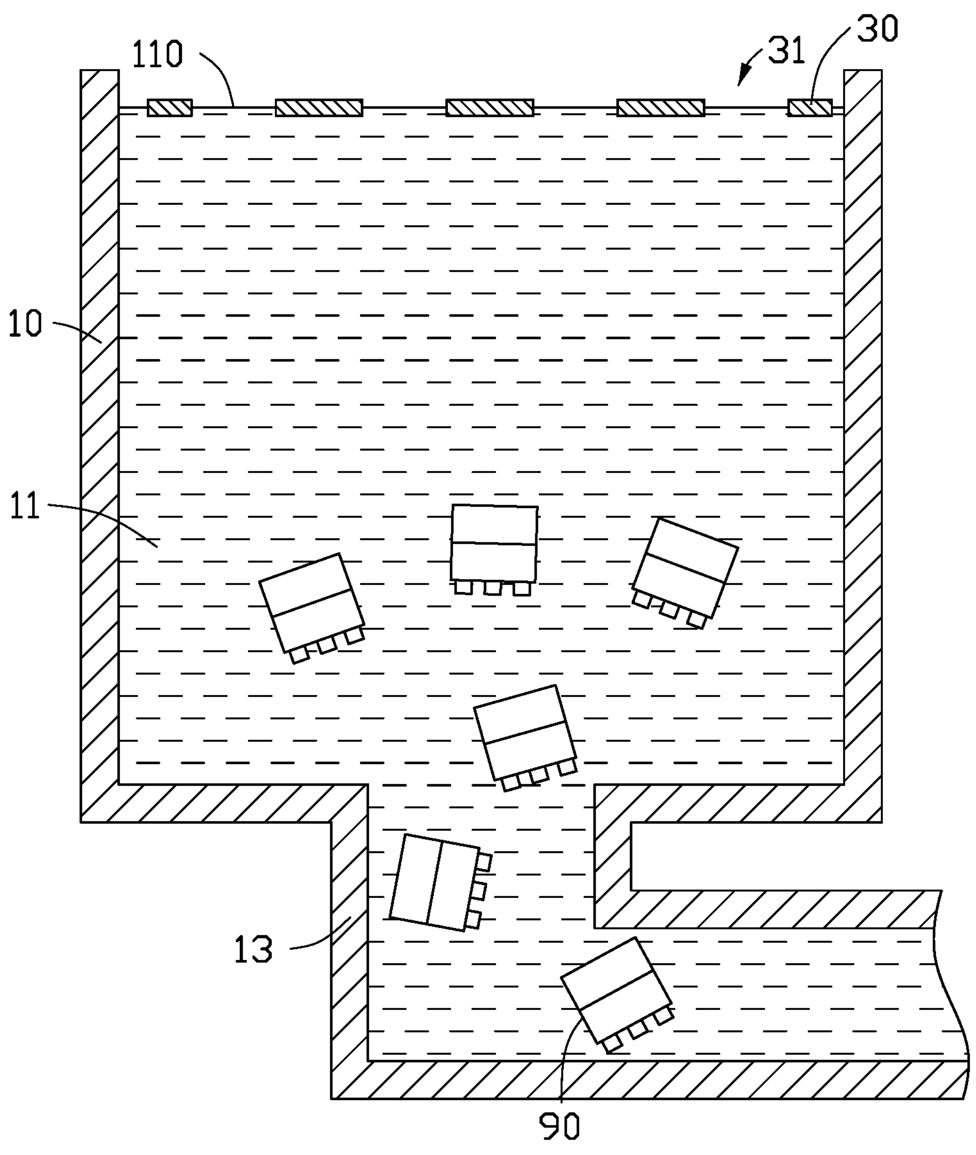
FIG. 5 is a sectional side view of a container with micro LEDs applied in block S2 in the method of FIG. 2.

In one embodiment, as shown in FIG. 5, the chamber 10 comprises a connecting assembly 13. The connecting assembly 13 is configured to control the connectivity of the inner and outer sides of the chamber 10. The connecting assembly 13 connects to the suspension 11 on bottommost side. Specifically, the connecting assembly 13 is a pipe at the bottom of the chamber 10, and is configured to inject the micro LEDs 90 into the chamber 10.

In other embodiments, the connecting assembly 13 can also be a plurality of pipes arranged on the side wall of the chamber 10, to deliver the micro LEDs 90 into the chamber 10 from different locations, as a result, the plurality of micro LEDs 90 achieves uniform distribution in the suspension 11.

By setting the connecting assembly 13, the micro LEDs 90 can float up from the suspension 11, so as to avoid a large number of the micro LEDs 90 accumulating at the surface 110 at the same time, resulting in blockage at the positioning holes 31, and affecting the flotation of the micro LEDs 90 into the positioning holes 31.

Figure 6:
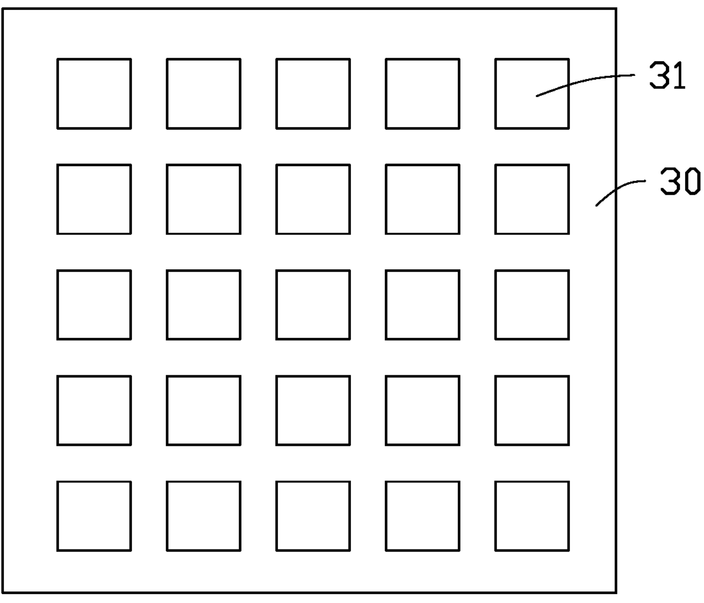
FIG. 6 is a top view of a positioning substrate according to an embodiment of the present disclosure.

In one embodiment, as shown in FIG. 6, the positioning substrate 30 defines a plurality of positioning holes 31 arranged in an array. The aperture and shape of the positioning holes 31 match the micro LEDs 90, to make each one of the positioning holes 31 expose a portion of one of the micro LEDs 90. By setting the distance between adjacent positioning holes 31, the distance between adjacent micro LEDs 90 can be controlled after being transferred on an array substrate.

In one embodiment, the material of the positioning substrate 30 can be metal, plastic, etc.

Figure 7:
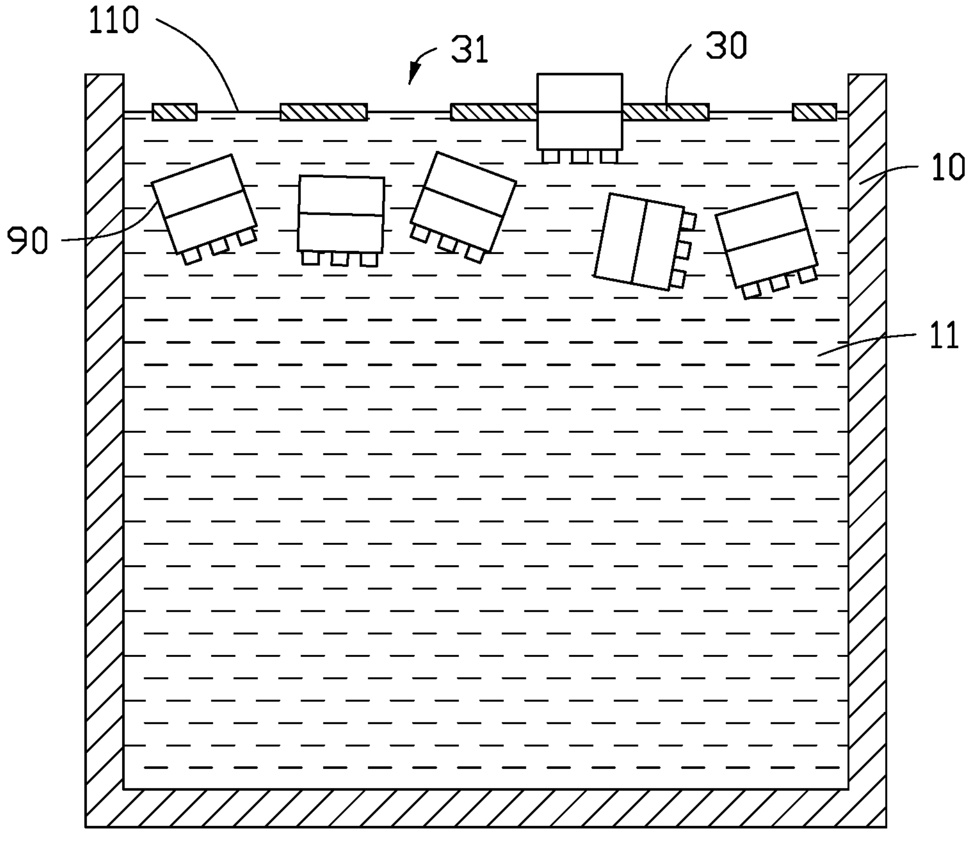
FIG. 7 is a sectional side view of the container with micro LEDs applied in block S4 in the method of FIG. 2.

In one embodiment, as shown in FIG. 7, in Block S4, the filling of each positioning hole with one of the plurality of micro LEDs is done by vibrating the positioning substrate 30 until each of the plurality of positioning holes 31 is filled with one of the plurality of micro LEDs 90.

Specifically, when the micro LEDs 90 are floating up, some of the micro LEDs 90 may pile up or be incorrectly presented at one of the positioning holes 31, and by vibrating the positioning substrate 30, such micro LEDs 90 are also vibrated and shift their positions. As a result, when the position of one the micro LEDs 90 matches one of the positioning holes 31, the micro LED 90 will float up into the positioning hole 31. The vibration of the positioning substrate 30 can comprise horizontal or the vertical vibration.

In one embodiment, when one of the micro LEDs 90 floats up into one of the positioning holes 31, a portion of the micro LED 90 will be exposed on the surface 110 of the suspension 11 because of the density being less than that of the suspension 11. By setting the position of the positioning substrate 30, the micro LED 90 can pass through the positioning hole 31 and be partially exposed on a side of the positioning substrate 30 away from the suspension 11. Since the density of the suspending part 95 is less than those of the luminous part 93 and electrode part 91, the suspending part 95 of each of the micro LEDs 90 floating in the positioning holes 31 is located away from the suspension 11 relative to the electrode part 91. As a result, at least part of the suspending part 59 is located on a side of the positioning substrate 30 away from the suspension 11.

Figure 8:
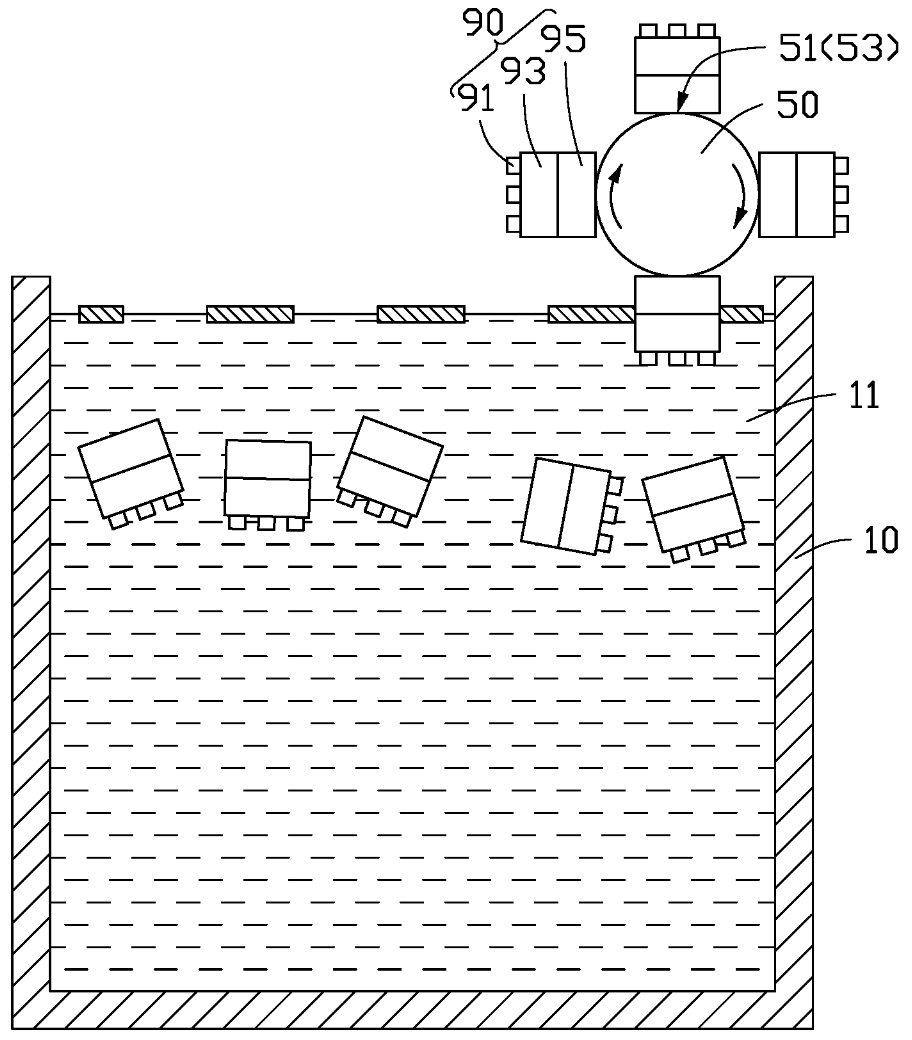
FIG. 8 is a sectional side view of the container with micro LEDs applied in block S5 in the method of FIG. 2.

In one embodiment, as shown in FIG. 8, the transfer roller 50 comprises an adhesive material 51. In Block S5, the micro LEDs 90 are adhered on the transfer roller 50 by the adhesive material 51. Specifically, the transfer roller 50 with adhesive material 51 is rolled over and across the positioning substrate 30 away from the suspension 11, adhering the suspending part 95 of all micro LEDs when covering the positioning holes 31, and adhering the micro LEDs 90 to the transfer roller 50 brings the micro LEDs 90 out and away from the positioning holes 31.

In another embodiment, the transfer roller 50 comprises a plurality of suckers 53. Each of the suckers 53 is used to adsorb one of the micro LEDs 90. When the transfer roller 50 rolls over the positioning substrate 30, each of the suckers 53 corresponds to one positioning hole 31. The Block S5 comprises: absorbing each of the micro LEDs 90 exposed by the positioning holes 31 to a sucker 53.

Figure 9:
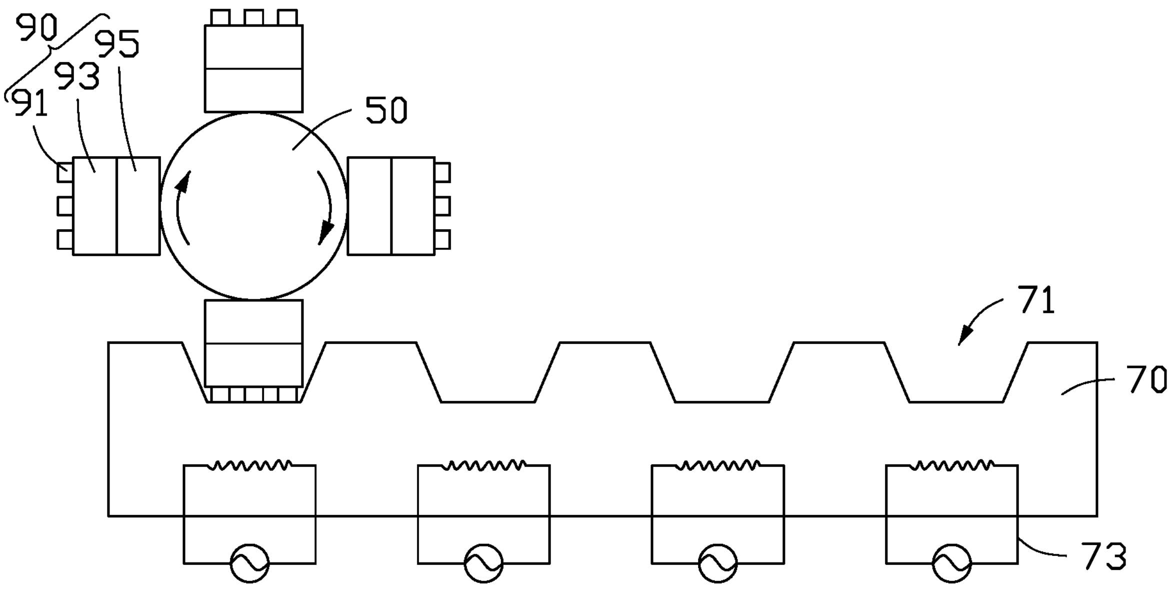
FIG. 9 is a side view of the array substrate applied in block S6 in the method of FIG. 2.

In one embodiment, as shown in FIG. 9, the Block S6 includes providing an array substrate 70. The array substrate 70 defines a plurality of trap sites 71, and each of the trap sites 71 can accommodate one of the plurality of micro LEDs 90. In Block S6, the transfer roller 50 carrying the plurality of micro LEDs 90 is rolled over the array substrate 70, and the plurality of micro LEDs 90 is transferred to the plurality of trap sites 71 on the array substrate 70.

In one embodiment, each of the plurality of micro LEDs 90 comprises a magnetic electrode, that is, the electrode part 91 of the micro LED 90 can be magnetic; or the Block S2 may include magnetizing the plurality of micro LEDs 90. A plurality of magnetic field generators 73 are defined on a side of the array substrate 70 away from the plurality of trap sites 71. Each of the plurality of magnetic field generators 73 corresponds to one of the plurality of trap sites 71. Block S6 can also comprise energizing the magnetic field generators 73 to generate an opposing magnetic field when the micro LEDs 90 on the transfer roller 50 individually coincide with the corresponding trap sites 71, and transferring the micro LEDs 90 from the transfer roller 50 to the corresponding trap sites 71. In other embodiment, one magnetic field generator 73 can also correspond to a plurality of the trap sites 73.

In one embodiment, the mass transfer system 100 can also comprise a plurality of chambers 10. The different chambers 10 are used to accommodate micro LEDs 90 used for emitting light of different colors, all the micro LEDs 90 in the same chamber 10 emit the same color. A plurality of transfer rollers 50 can transfer the plurality of micro LEDs 90 from different chambers 10 onto the array substrate 70, and arrange micro LEDs 90 of different colors as required on the array substrate 70, to realize image display.

In other embodiments, the mass transfer system 100 can include only one chamber 10, after transferring micro LEDs 90 of one color to the array substrate 70, micro LEDs 90 of another color be put into the chamber 10. Then Block S2 to Block S6 are repeated per color, until the array substrate 70 is filled with micro LEDs 90 emitting light of required and different colors.

In one embodiment, the mass transfer method after the Block S6 also comprises: checking the positions of the plurality of micro LEDs 90 via the photoresist. Specifically, the positions of the plurality of micro LEDs 90 can be checked through the suspending part 95 since the material of the suspending part 95 is photoresist with the same color as the light emitted by the micro LED 90. As a result, the process of checking the positions of the plurality of micro LEDs 90 by illuminating them can be omitted.

Since the micro LEDs 90 are put into the chamber 10 filled with the suspension 11, the plurality of micro LEDs 90 can be suspended in the positioning holes 31 by buoyancy, and the distance between the plurality of micro LEDs 90 can be set. By using the transfer roller 50 to transfer the plurality of micro LEDs 90 from the positioning substrate 30 to the array substrate 70, the plurality of micro LEDs 90 can be transferred with high efficiency and low cost. By setting the suspending part 95, the arrangement and presentation of the micro LEDs 90 floating at the plurality of positioning holes 31 can be controlled. By setting the material of the suspending part 95 with the same color as the light actually to be emitted, the positions of the plurality of micro LEDs 90 can be checked through the suspending part 95 after transferring the plurality of micro LEDs 90 onto the array substrate 70. The process of checking the positions of the plurality of micro LEDs 90 for color is optimized.

Figure 10:
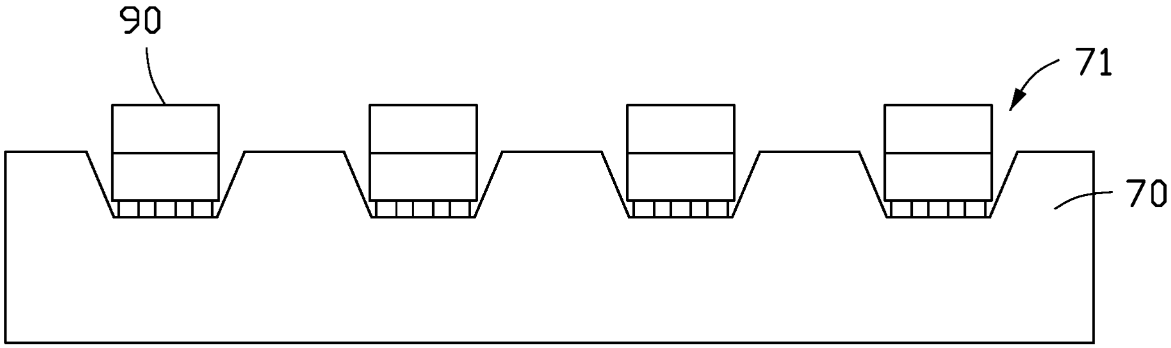
FIG. 10 is a side view of a display with micro LEDs installed on the display according to an embodiment of the present disclosure.

FIG. 10 shows a display 200 according to an embodiment of the present disclosure. In one embodiment, the display 200 is self luminous display, and comprises the array substrate 70 with the plurality of micro LEDs 90 arranged on the array substrate 70. Specifically, a plurality of trap sites 71 is defined on the array substrate 70, and each micro LED 90 is held in one trap site 71. The array substrate 70 also comprises a thin film transistor circuit used for electrical connection to each of the plurality of micro LEDs 90 and control the luminescence state of each of the plurality of micro LEDs 90, as a result, image display can be achieved. In other embodiments, the display 200 can also be a non-self luminous display, the array substrate 70 with the plurality of micro LEDs 90 can be a backlight module of the display 200.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A micro light-emitting diode (micro LED) comprising:
an electrode part comprising at least one electrode;
a luminous part on a side of the electrode part; and
a suspending part on a side of the luminous part away from the electrode part;
wherein a density of the suspending part is less than a density of the luminous part and a density of the electrode part, and a color of the suspending part is same as a color of light emitted by the micro LED.

2. The micro light-emitting diode of claim 1,
wherein the electrode part comprises a cathode electrode and an anode electrode spaced apart from each other on a same side of the luminous part; or
wherein the micro LED further comprises an upper electrode on the side of the luminous part away from the electrode part, the suspending part exposes the upper electrode, one of the at least one electrode of the electrode part and the upper electrode is a cathode electrode, and the other one of the at least one electrode of the electrode part and the upper electrode is an anode electrode.

3. The micro light-emitting diode of claim 1, wherein the micro LED is a vertical micro LED.

4. The micro light-emitting diode of claim 1, wherein the suspending part is a light-transmitting photoresist.

5. The micro light-emitting diode of claim 1, wherein the electrode part is magnetic.

* * * * *